United States Patent
Schwarz et al.

(10) Patent No.: US 11,984,435 B2
(45) Date of Patent: May 14, 2024

(54) MULTI-PIXEL DISPLAY DEVICE WITH LIGHT-GUIDING STRUCTURES AND LIGHT-EMITTING SEMICONDUTOR CHIPS DISPOSED ON INTERATED CIRCUIT

(71) Applicant: OSRAM Opto Semiconductors GmbH, Regensburg (DE)

(72) Inventors: Thomas Schwarz, Regensburg (DE); Frank Singer, Regenstauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 442 days.

(21) Appl. No.: 17/289,114

(22) PCT Filed: Nov. 8, 2019

(86) PCT No.: PCT/EP2019/080728
§ 371 (c)(1),
(2) Date: Apr. 27, 2021

(87) PCT Pub. No.: WO2020/104219
PCT Pub. Date: May 28, 2020

(65) Prior Publication Data
US 2021/0384170 A1    Dec. 9, 2021

(30) Foreign Application Priority Data
Nov. 20, 2018    (DE) .................. 10 2018 129 209.0

(51) Int. Cl.
*H01L 25/075*    (2006.01)
*H01L 33/10*    (2010.01)
(Continued)

(52) U.S. Cl.
CPC .......... *H01L 25/0753* (2013.01); *H01L 33/10* (2013.01); *H01L 33/58* (2013.01); *H01L 33/62* (2013.01)

(58) Field of Classification Search
CPC ..... H01L 25/0753; H01L 33/10; H01L 33/58; H01L 33/62
See application file for complete search history.

(56) References Cited

U.S. PATENT DOCUMENTS 9,318,475 B2     4/2016   Bibl et al.
2012/0140464 A1* 6/2012   Huang ................... F21V 5/002
                                                        362/235
(Continued)

FOREIGN PATENT DOCUMENTS

CN     102537712 A    7/2012
CN     105122450 A    12/2015
(Continued)

OTHER PUBLICATIONS

International Search Report issued for corresponding International Patent Application No. PCT/EP2019/080728 dated Jan. 30, 2020, along with an English translation.
(Continued)

*Primary Examiner* — Lex H Malsawma
(74) *Attorney, Agent, or Firm* — HAUPTMAN HAM, LLP

(57) ABSTRACT

A multi-pixel display device with an integrated circuit, a plurality of light-emitting semiconductor chips disposed on the integrated circuit, a display area having a plurality of pixels, each of the light-emitting semiconductor chips being (Continued)

associated with one of the pixels, a light-directing element disposed between the plurality of light-emitting semiconductor chips and the display area and adapted to direct the light of each light-emitting semiconductor chip from the plurality of light-emitting semiconductor chips to its associated pixel.

14 Claims, 12 Drawing Sheets

(51) Int. Cl.
  *H01L 33/58* (2010.01)
  *H01L 33/62* (2010.01)

(56) References Cited

U.S. PATENT DOCUMENTS

| | | | |
|---|---|---|---|
| 2015/0333221 A1* | 11/2015 | Bibl | H01L 21/6835 438/34 |
| 2015/0362165 A1 | 12/2015 | Chu et al. | |
| 2016/0076731 A1* | 3/2016 | Mönch | G02B 19/0066 362/97.1 |
| 2017/0038028 A1 | 2/2017 | Cho et al. | |
| 2018/0047876 A1 | 2/2018 | Chu et al. | |
| 2018/0090058 A1 | 3/2018 | Chen et al. | |
| 2018/0166428 A1* | 6/2018 | Goldbach | H01L 24/49 |
| 2018/0261149 A1* | 9/2018 | Lin | H01L 25/167 |

FOREIGN PATENT DOCUMENTS

| | | |
|---|---|---|
| CN | 107078132 A | 8/2017 |
| CN | 107078148 A | 8/2017 |
| DE | 10 2013 104 046 A1 | 10/2014 |
| DE | 10 2014 105 734 A1 | 10/2015 |
| DE | 10 2016 216 811 A1 | 3/2018 |
| DE | 10 2017 107 303 A1 | 10/2018 |
| TW | 201814880 A | 4/2018 |
| WO | 2015/162023 A1 | 10/2015 |
| WO | 2018/046216 A1 | 3/2018 |

OTHER PUBLICATIONS

Written Opinion issued for corresponding International Patent Application No. PCT/EP2019/080728 dated Jan. 30, 2020.
Wikipedia, "Screen-door effect", https://en.wikipedia.org/wiki/Screen-door_effect [Accessed Mar. 10, 2021].
Office Action dated Oct. 12, 2023 for corresponding Chinese Patent Application No. 201980066133.X, along with an English translation (19 pages).

* cited by examiner

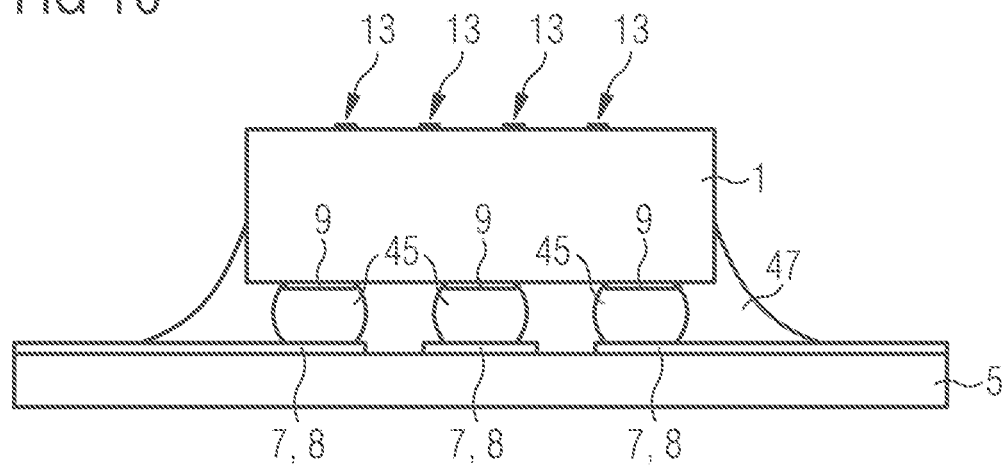
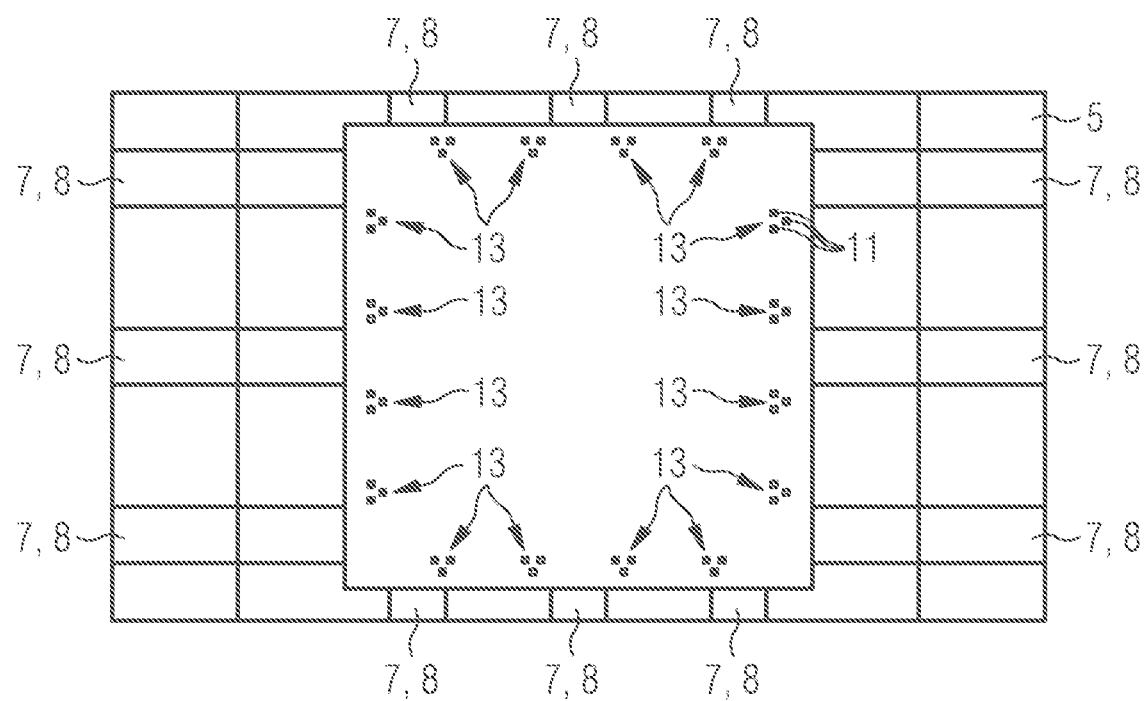

MULTI-PIXEL DISPLAY DEVICE WITH LIGHT-GUIDING STRUCTURES AND LIGHT-EMITTING SEMICONDUTOR CHIPS DISPOSED ON INTERATED CIRCUIT

CROSS REFERENCE TO RELATED APPLICATION

This application is a National Stage of International Application No. PCT/EP2019/080728, filed on Nov. 8, 2019, which designates the United States and was published in Europe, and which claims priority to German Patent Application No. 10 2018 129 209.0, filed on Nov. 20, 2018, in the German Patent Office. Both of the aforementioned applications are hereby incorporated by reference in their entireties.

The invention relates to a multi-pixel display device.

μLED displays comprise a plurality of light-emitting semiconductor chips for the pixels of the display. LEDs of small design are referred to as "micro-LEDs" or "μLEDs". They can be driven by pulse width modulation, or "PWM" for short. However, the thin film transistors (TFT) used for this purpose can only realize frequencies of up to 1 MHz.

Therefore, many applications require the use of integrated circuits, (IC for short), as drivers instead of the previously mentioned TFTs. To reduce the cost of ICs, multiple pixels are driven by one IC. However, this approach has the disadvantage that a plurality of driven μLEDs must be mounted on a relatively large carrier area around the driver IC, which involves higher (cost) effort. Many connections and many narrow electrical conductor paths to the μLEDs have to be provided for contacting the IC. The document U.S. Pat. No. 9,318,475 shows such an arrangement, wherein many μLEDs with driver ICs are mounted on a circuit board and electrically connected to the driver ICs. One IC drives 12 pixels with 36 subpixels, i.e. μLEDs, and has 64 connection contacts.

The object is to provide an improved arrangement with multiple pixels.

The object is to be achieved by a multi-pixel display device comprising an integrated circuit and a plurality of light-emitting semiconductor chips disposed on the integrated circuit. A display area includes a plurality of pixels, each of the light-emitting semiconductor chips being associated with one of the pixels. A light-directing element is disposed between the plurality of light-emitting semiconductor chips and the display area, and adapted to direct light from each light-emitting semiconductor chip of the plurality of light-emitting semiconductor chips to the pixel associated therewith.

The integrated circuit or IC is a semiconductor chip on which the light-emitting semiconductor chips, which are configured as LEDs or μLEDs, for example, are mounted and electrically conductively connected to the integrated circuit, so that the integrated circuit also has a carrier function in addition to its driver function for the light-emitting semiconductor chips. The light-emitting semiconductor chips can have a housing or, for the purpose of a smaller size, be unpackaged. The light-emitting semiconductor chips are the light sources for the pixels in the display area. Light-emitting semiconductor chips are provided for at least two pixels on the IC. The light is directed to the location of the pixels by means of the light-directing element from the light-emitting semiconductor chip. The area where the pixels extend in the display area extends beyond the area where the light-emitting semiconductor chips are located. The display area with the pixels is generally larger than the base area of the IC with the light-emitting semiconductor chips arranged thereon. In other words, the core idea comprises not placing the light-emitting semiconductor chips, such as μLEDs, in each pixel, but placing light-emitting semiconductor chips for multiple pixels on the driver IC. The IC is a multi-pixel driver IC with light-emitting semiconductor chips whose light is optically distributed for the pixels. The light from the light-emitting semiconductor chips is directed into the pixels by the light-directing element, which can also be referred to as optics. The light-directing element enables the light distribution into the pixels. The IC is advantageously as small as possible to save costs. Nevertheless, sufficient space must be provided for the light-emitting semiconductor chips.

A display or a display device can be formed from multiple multi-pixel display devices each having an IC. Multiple multi-pixel display devices for the display may be integrated into one display. Alternatively, the display may be formed of multiple multi-pixel display device modules each having one IC. In the multi-pixel display device described above, a relatively small number of pixels, such as less than 100, are combined for one driver IC, and many such driver ICs are provided in the display. The distance from the light source to the surface of the display area, comparable to a screen on which the image appears, is much smaller than would be the case in an approach in which a densely packed μLED array comprising all pixels of a display would be imaged onto a screen using optics. This would require a large distance between the light sources and the screen.

For example, μLEDs for up to 100 pixels are provided on the IC. In a HD display, there would thus be at least 20,000 such ICs in corresponding multi-pixel display devices.

The multi-pixel display device is accompanied by significantly reduced electrical wiring requirements and thus reduced requirements and costs for the substrate on which the IC is mounted. A small number of IC electrical contacts are required, which is accompanied by ease of assembly.

Unlike the conventional approach, where one IC is provided for each light-emitting semiconductor chip, fewer ICs are required and the light-emitting semiconductor chips are not mounted on the substrate. Rather, they can be densely and thus cost-effectively pre-mounted on the IC and tested.

By providing the light-directing element below the display area, the risk of ESD damage and mechanical damage to the IC and light-emitting semiconductor chips is low because they are so far away from the user.

In one embodiment of the multi-pixel display device, more than one light-emitting semiconductor chip is associated with a pixel. This can be a group with one red, one blue and one green light-emitting semiconductor chip. The light-directing element provides good light mixing in its light-guiding regions. Red, green and blue subpixels are not visible separately, even at a short viewing distance.

In one embodiment, the pixel to which the emitted light is directed is arranged laterally offset above its associated light-emitting semiconductor chip or light-emitting semiconductor chips. Since the base area of the display area is larger than that of the IC, the pixels are typically arranged beyond the base area of the IC with the light-emitting semiconductor chips.

In one embodiment, the light-directing element having a top side and a bottom side has a plurality of light-guiding structures each having an in-coupling area on the bottom side and one of the pixels over an out-coupling area on the top side. Light travels from the light-emitting semiconductor chips to the pixels along light guiding structures in the light-directing element. The light-emitting semiconductor chip or light-emitting semiconductor chips associated with the pixel are located adjacent to the in-coupling area of the light guiding structure comprising the pixel. A reflector may be disposed laterally to the light-emitting semiconductor chip or the light-emitting semiconductor chips to direct laterally emitted light onto the in-coupling area.

The light-guiding element, also referred to as an optic, can be a structured light guide stack in which structured layers of different materials form the light-guiding structures by having a light-guiding core material provide the light path in a cover material. In other words: A plurality of layers with light-guiding regions are provided in the light-directing element. By stacking the layers with different light-guiding regions, a three-dimensional light path is predetermined through the stack of layers.

Alternatively, the light-guiding element comprises freespace optics in which light is directed on its way from the light-emitting semiconductor chips to the pixels by optical components integrated in the light-guiding element. Such free space optics may include lenses and other optical components. In free space optics, the light-guiding structure is the path of light through the optics specified by optical components. In-coupling and out-coupling areas may include apertures and/or optical components, such as lenses or collimators.

In one embodiment, the light-directing element has at least one collimator. A collimator serves to generate light with a bundled, in particular approximately parallel, beam path and enables the bundling of the emitted light.

In one embodiment, the light-directing element includes at least one reflector, such as a mirror, to deflect light. The optics may be free space optics with flat or curved reflectors.

In one embodiment, the light-directing element includes at least one focuser for bundling light. Such a focuser may comprise a lens.

In one embodiment, the light-directing element comprises at least one optical waveguide. Such a cable-shaped optical waveguide or glass fiber allows light transmission along the cable. The cable may be enclosed by a filler material for protection and mechanical stabilization. The optics may be a fiber bundle with fiber coupling with or without in-coupling optics.

In one embodiment of the multi-pixel display device, the light-emitting semiconductor chips are arranged along one or more circles or along a line or in array on the integrated circuit. The semiconductor chips may be arranged at the edge, centrally, or distributed across the base area on the integrated circuit. For example, one or more rows may be arranged at the edge.

In one embodiment, the display area has a dark, preferably black, layer in or over whose recesses the pixels are arranged. This allows for better contrast. The multi-pixel display device may have relatively small light spots as pixels with a relatively large black area around them. Alternatively, the light spot may fill the entire pixel because the light is projected onto a spaced-apart screen that acts as a diffusing plate. The advantage here is that no screen door effect occurs. In such embodiments, but also in alternative embodiments, the display area has a scattering layer.

The multi-pixel display device may further comprise a substrate on which the integrated circuit is disposed and electrically conductively connected to contact areas on the substrate. The contact areas are electrically conductively connected to contacts of the IC to power and drive it. Because of the mounting and associated electrical contacting of the light-emitting semiconductor chips on the IC, the IC advantageously has external contacts only for power and/or voltage supply, data and clock/synchronization. LED connections are not required. The IC can be electrically contactable and electrically connected to the contact areas by wire contacting, planar connections (so-called "planar interconnects") or in flip-chip assembly.

In the following, the multi-pixel display device is explained in more detail with reference to exemplary embodiments and the associated figures.

FIG. 10 and FIG. 11 show a schematic representation of an exemplary embodiment of an intermediate product of a multi-pixel display device in a side view and a top view, respectively.

FIG. 1 illustrates the basic idea for the multi-pixel display device by showing the light paths from two integrated circuits 1, or ICs, to the pixels. An IC 1 is a semiconductor chip with an electronic circuit mounted on a semiconductor material wafer.

Figure 1:
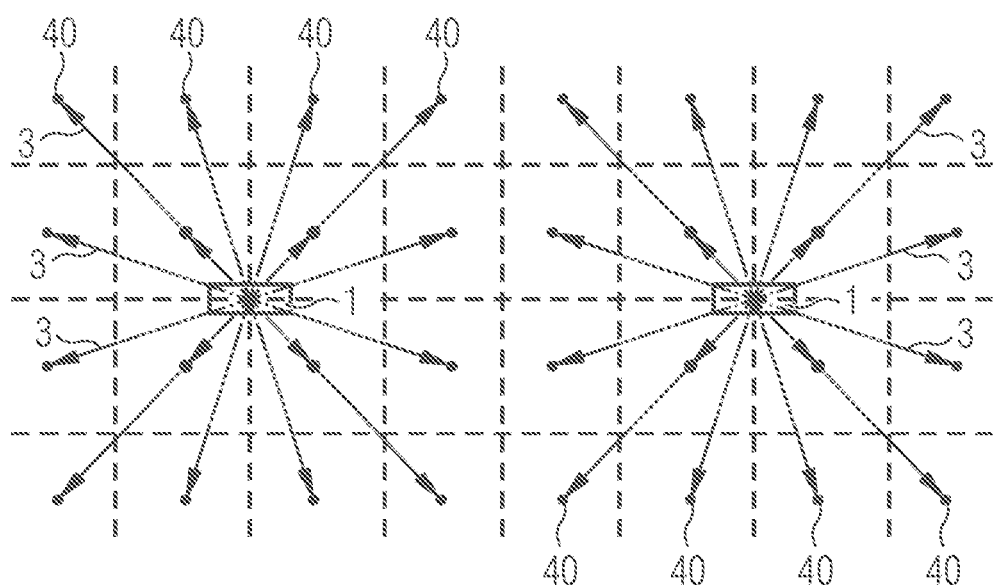
FIG. 1 illustrates the basic idea for a multi-pixel display device.

On each of the ICs 1, several µLEDs are arranged as exemplary embodiments of light-emitting semiconductor chips 11 (not shown in FIG. 1) whose light, for example in the colors red, blue and green, is guided to the pixels 40 adjacent to the IC 1, as illustrated by the arrows 3. The pixels 40 are arranged beyond the base area of the IC 1. For example, a pixel 40 may have an area of 1×1 mm or 0.1×0.1 mm. For example, the IC 1 may have a base area of 0.15×0.3 mm or 0.1×0.1 mm.

In the following, exemplary embodiments of multi-pixel display devices are described using, among others, intermediate manufacturing products to explain the individual components and their functions.

Figure 2:
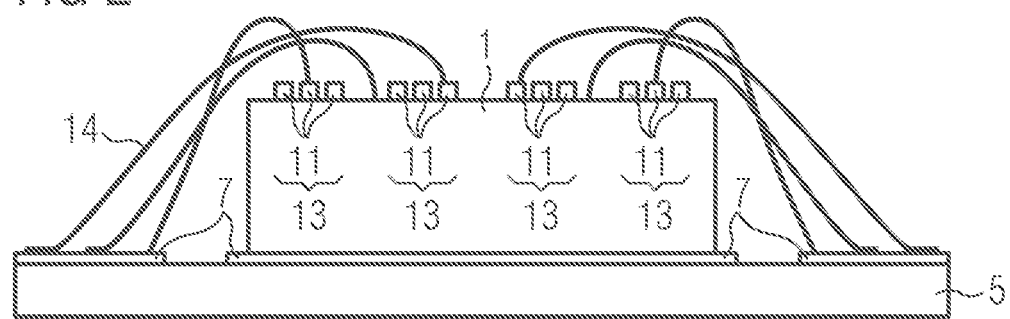
FIG. 2 and FIG. 3 show a schematic representation of an exemplary embodiment of an intermediate product of a multi-pixel display device in side view and top view, respectively.
Figure 3:
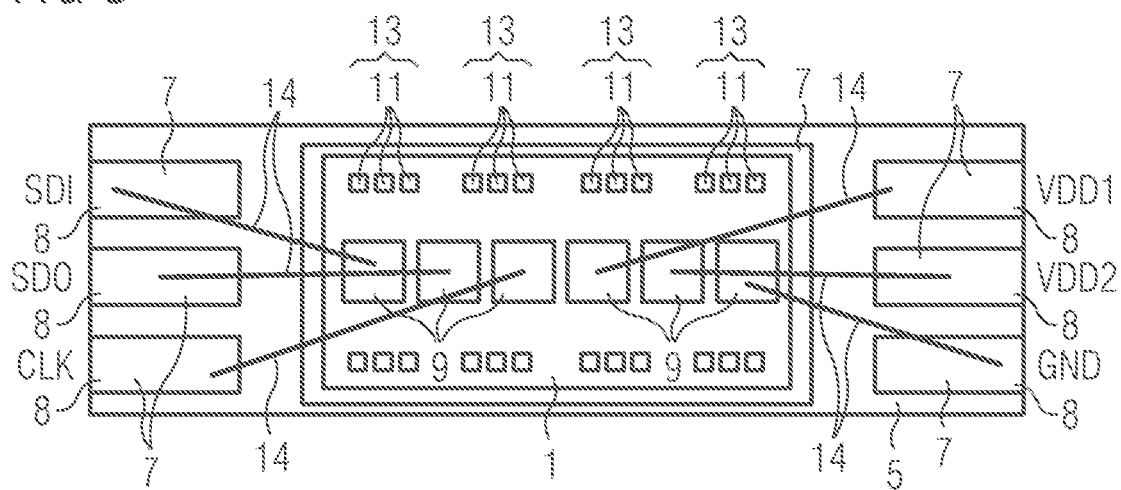

FIG. 2 shows a schematic representation of an exemplary embodiment of an intermediate product of a multi-pixel display device in the side view. FIG. 3 shows a schematic representation of the same intermediate product in top view.

The multi-pixel display device, as well as the intermediate product shown, comprises an integrated circuit 1 formed as a semiconductor chip and a substrate 5, for example comprising a printed circuit board (PCB), on the upper surface of which conductive structures 7 are arranged. The conductive structures include, among other things, contact areas 8 which are electrically conductively connected to the IC 1 in order to supply and drive it. Conductive structures 7 extending beyond this can be provided below the IC 1.

In this exemplary embodiment, six contact areas 8 are provided for the following voltages or signals: a first supply potential VDD1 and a second supply potential VDD2, a reference potential GND, a serial data input and output SDI and SDO, respectively, and a clock signal CLK for clocking the data or a refresh rate. The first supply voltage applied between the first supply potential VDD1 and the reference potential GND can be, for example, 4 V for LEDs, and the second supply voltage applied between the second supply potential VDD2 and the reference potential GND can be, for example, 1.8 V for IC 1.

The IC 1 is mounted on the substrate 5, for example a printed circuit board (PCB). The length of the IC 1 can be 300 μm, its width 150 μm and its height 100 μm. The IC 1 has contacts 9 on its upper side via which it is supplied and controlled, as well as a plurality of light-emitting semiconductor chips 11, for example μLEDs. The light-emitting semiconductor chips 11 are arranged along two rows in groups of three on both long sides of the IC 1. In this exemplary embodiment, a plurality of groups 13 of three light-emitting semiconductor chips 11 each are provided in red, green, blue. Each group 13 is assigned to a pixel (not shown in FIGS. 2 and 3) and is suitable for generating its light.

The light-emitting semiconductor chips 11 are mounted on and electrically connected to the IC 1 in such a way that it acts as a driver to drive the light-emitting semiconductor chips 11. In other words, the IC 1 serves not only as a driver IC but also as a carrier for the light-emitting semiconductor chips 11.

The contacts 9 of the IC 1 are connected to the contact areas VDD1, VDD2, GND, SDI, SDO, CLK on the substrate 5 via wire contacts 14. The wire contacts 14 allow easy contacting. However, they have a space requirement in excess of the IC height, and there is a risk of shadowing the light-emitting semiconductor chips 11 if a wire contact 14 were to pass over them. The latter is avoided in the exemplary embodiment by arranging the light-emitting semiconductor chips 11 on the long sides of the IC 1 and by arranging the contacts 9 in the center of the IC 1, with the wire contacts 14 running over the broad sides of the IC 1.

Figure 4:
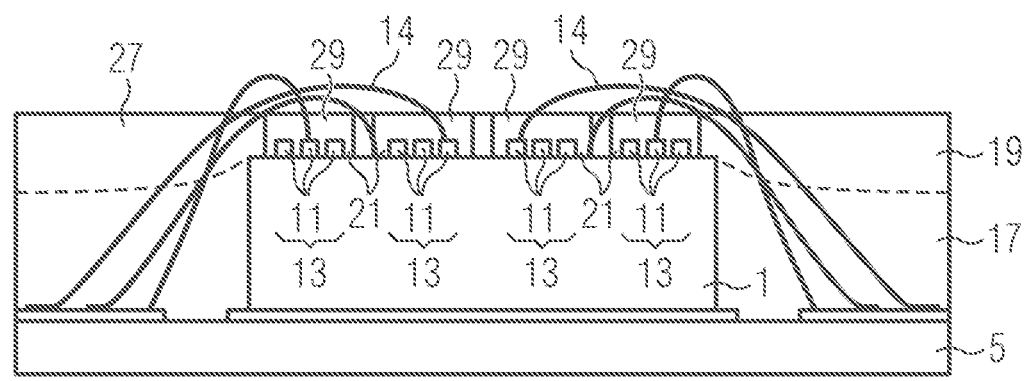
FIG. 4 and FIG. 5 show a schematic representation of an exemplary embodiment of an intermediate product of the multi-pixel display device in a side section view and a top view, respectively.
Figure 5:
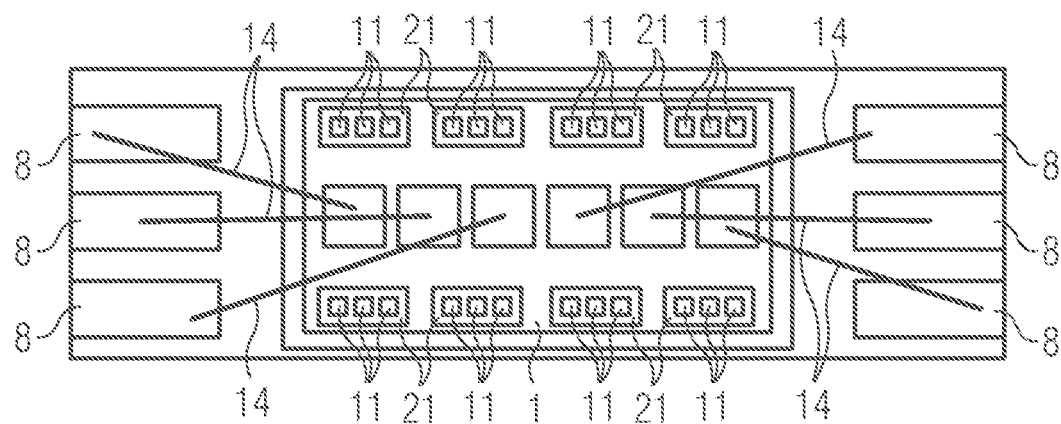

FIG. 4 shows a schematic representation of an exemplary embodiment of an intermediate product of the multi-pixel display device, based on the intermediate products previously shown in FIGS. 2 and 3, in a side section view in the area of the light-emitting semiconductor chips 11. FIG. 5 shows a schematic representation of the intermediate product in a top view.

In the intermediate product shown, a lateral casting 17, for example as an epoxy casting, is arranged on the IC 1. This optional casting 17 enables planarization. A structured layer is arranged on the casting 17. This can be a photo-structured polymer layer 19, for example made of or with EpoClad. Alternatively, the polymer can also form the lateral sheathing of the IC 1. However, it may prove difficult to apply the photostructurable material in sufficient thickness for this purpose.

Openings 21 are provided in the polymer layer 19 in the regions of the groups 13 of light-emitting semiconductor chips 11. The polymer material serves as coating material 27 for light-guiding regions 31 with a lower refractive index, which are formed within the polymer layer 19 from another material, the so-called core material 29. The openings 21 are in-coupling areas of the later light-guiding regions 31. Light emitted from the light-emitting semiconductor chips 11 passes in light-guiding regions 31.

Figure 6:
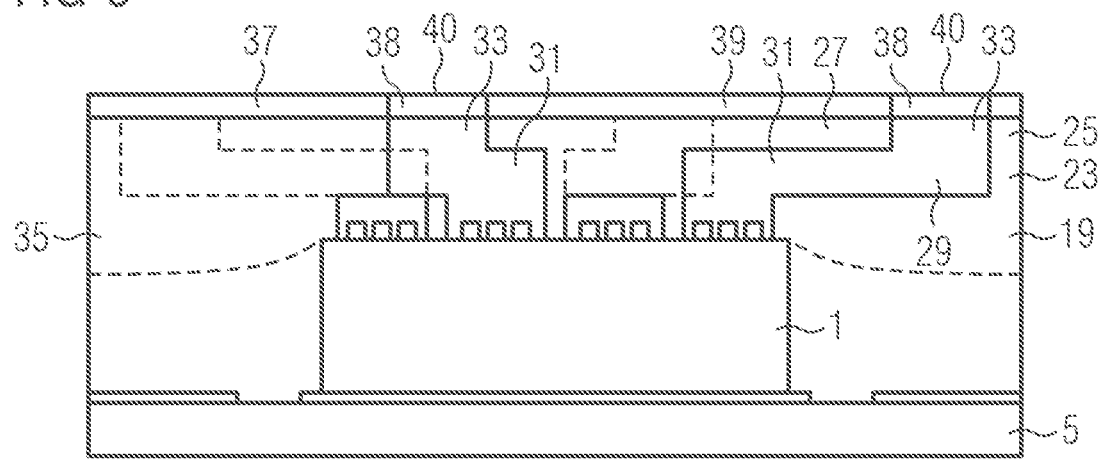
FIG. 6 and FIG. 7 show a schematic representation of an exemplary embodiment of the multi-pixel display device in a side view and a top view, respectively.
Figure 7:
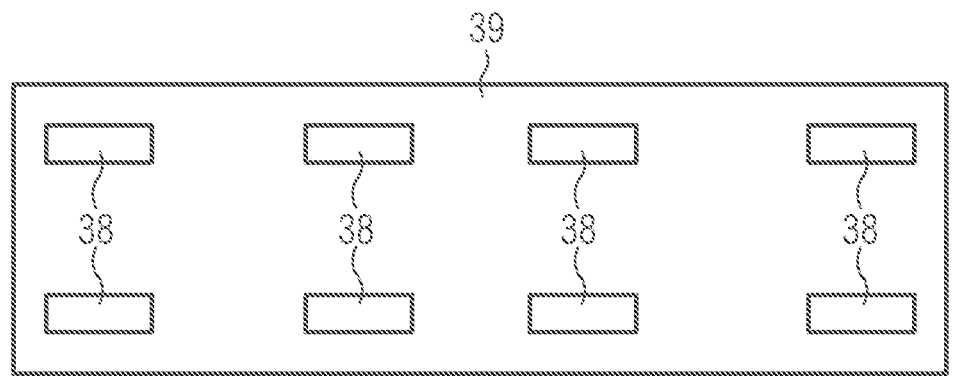

FIG. 6 shows a schematic representation of an exemplary embodiment of the multi-pixel display device, based on the intermediate products previously shown in FIGS. 4 and 5, in a side view. FIG. 7 shows a schematic representation of the multi-pixel display device in top view.

The multi-pixel display device has a light-directing element 35 formed by structured polymer layers 19, 23, 25 on the IC 1. In addition to the lower polymer layer 19 already shown in FIG. 4, a middle structured polymer layer 23 and an upper structured polymer layer 25 made of cover material 27 and core material 29 are also provided in this embodiment. In the middle layer 23, light-guiding regions 31 of core material 29 are formed transversely, that is, perpendicular to the IC height, extending from the light-emitting semiconductor chips 11 to the pixels 40, and in which the light is guided away from the light-emitting semiconductor chips 11 and the IC 1. In layer-by-layer fabrication, structured cover material layers 27, for example made of EpoClad, and core material 29 with a higher refractive index are deposited and photostructured. Openings 33 are provided in the upper structured polymer layer 25, which serve as out-coupling areas and by means of which the light is guided to a display area 37 with pixels 40. The upper cover material layer covers the planar waveguide formed from core material 29 and allows the light to escape upward at the location of pixels 40 via the openings 33.

For clarity, only two light-guiding regions 31 are shown in FIG. 6. The others are indicated by dashed lines.

On the top of the multi-pixel display device is the display area 37 with the pixels 40. To achieve good contrast, the top of the display area 37 is blackened, for example by a photo-textured black polymer such as Daxin BLRO301 applied as a black layer 39 with recesses 38 for the pixels 40. Alternatively, the light can shine on a diffuser covered by a λ/4 plate with polarizer (also black on the outside) (not shown).

Figure 8:
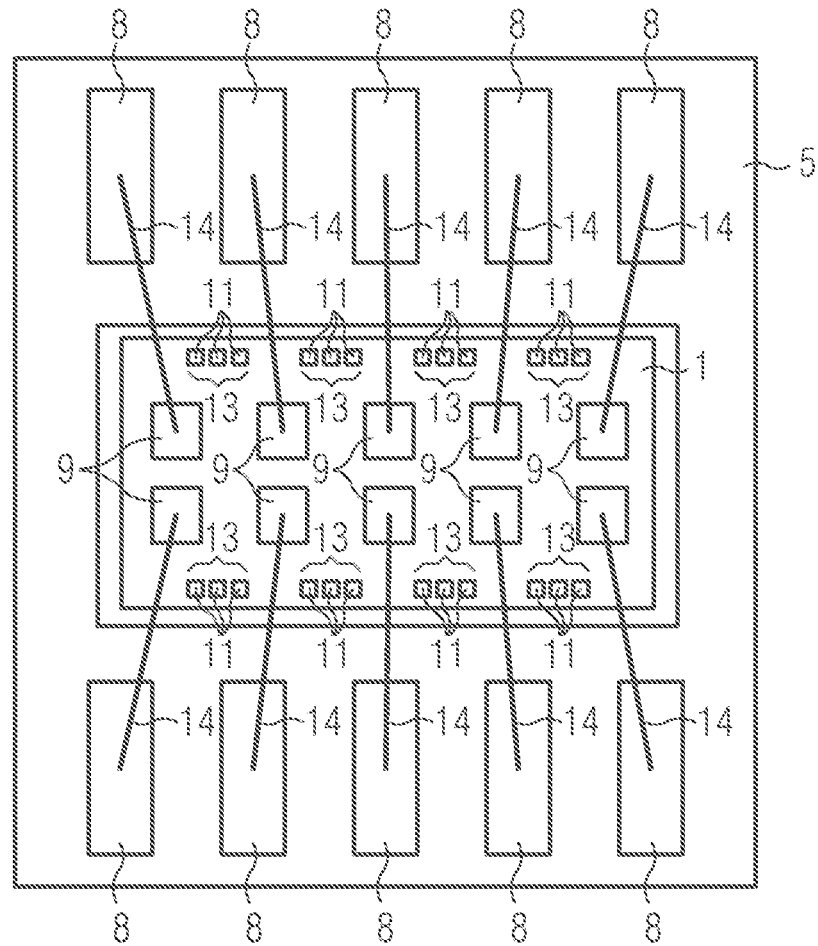
FIG. 8 shows a schematic representation of an exemplary embodiment of an intermediate product of a multi-pixel display device.

FIG. 8 shows a schematic top view of an embodiment of an intermediate product of a multi-pixel display device. To avoid repetition, only the differences to the intermediate product shown in FIG. 3 are described.

The wire contacts 14 are led from the contacts 9 on the IC 1 over the longitudinal sides of the IC 1 and between the groups 13 of light-emitting semiconductor chips 11 to the contact areas 8 on the substrate 5. The IC 1 is arranged between the contact areas 8 on the substrate 5 so that its long sides are adjacent to them. The contacts 9 on the IC 1 are arranged in two rows between the light-emitting semiconductor chips 11 on the long sides.

In contrast to the exemplary embodiment in FIG. 3, whose wire guide is favorable for the optical properties but electrically rather unfavorable due to the risk of short-circuit, the wire guide shown in FIG. 8 is an electrically more favorable, but optically slightly less favorable variant.

In this exemplary embodiment, more than six contacts 9 are provided on the IC 1 and the same number of contact areas 8 are provided on the substrate 5, for example for further voltage potentials or reference potentials or further clock signals (for example for the refresh rate).

Figure 9:
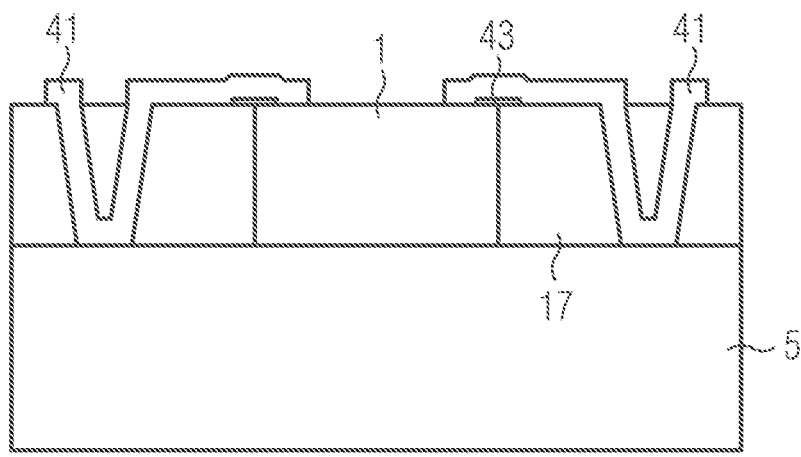
FIG. 9 shows a schematic representation of an exemplary embodiment of an intermediate product of a multi-pixel display device in a side section view.

FIG. 9 shows a schematic representation of an embodiment of an intermediate product of a multi-pixel display device in a side section view. To avoid repetition, only the differences to the intermediate product shown in FIG. 2 are described.

Instead of a wire contact 14, a planar connection 41 is provided in this embodiment. It runs on the IC 1 and the casting 17 surrounding it between the contacts and contact areas via an insulating layer 43 to prevent short circuits. Such a planar connection is also referred to as a "planar interconnect". In this case, there is no optical impairment due to the contacting.

The exemplary embodiments described so far can also be used for curved or flexible displays.

FIG. 10 shows a schematic representation of an exemplary embodiment of an intermediate product of a multi-pixel display device in the side view. FIG. 11 shows a schematic representation of the intermediate product in top view.

The multi-pixel display device comprises an integrated circuit 1 and a substrate 5, on the upper surface of which conductive structures 7 are arranged, which are formed, inter alia, as contact areas 8 for supplying and driving the integrated circuit 1.

The IC 1 is mounted on the contact surfaces 8 by means of flip-chip mounting. In this exemplary embodiment, the IC 1 has a square base area, for example with an edge length of 200 μm. Its contacts 9 are arranged on the underside and are connected to the contact areas 8 on the substrate 5 by means of solder balls 45. An underfill 47 is provided between the substrate 5 and the underside, which surrounds the solder balls 45 and can extend to the side edges of the IC 1.

A plurality of light-emitting semiconductor chips 11, for example μLEDs, are mounted on the top of the IC 1 in groups 13, each with a red, green and blue μLED. Each group 13 is associated with a pixel (not shown in FIGS. 10 and 11). The groups 13 are arranged at the edge of the IC 1 in order to be able to guide the light to the pixels in a simple manner.

Flip-chip mounting increases the space for the optical components on the top of the IC 1. However, it is technically more difficult to implement because electrical through contacts have to be made in the substrate of the IC 1.

Figure 12:
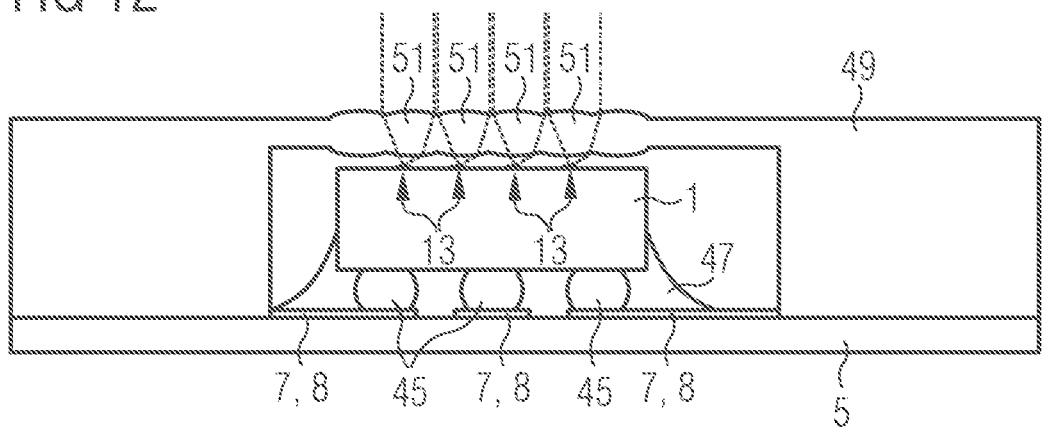
FIG. 12 and FIG. 13 show a schematic representation of an exemplary embodiment of an intermediate product of the multi-pixel display device in a side section view and a top view, respectively.
Figure 13:
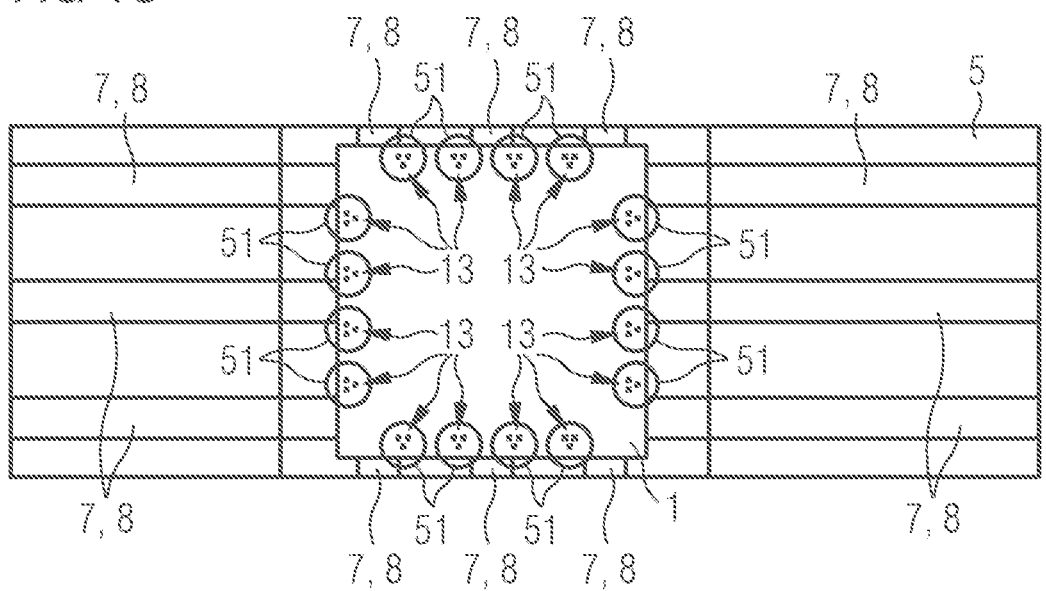

FIG. 12 shows a schematic illustration of an exemplary embodiment of an intermediate product of the multi-pixel display device, based on the intermediate products previously shown in FIGS. 10 and 11, in a side sectional view. FIG. 13 shows a schematic representation of the intermediate product in plan view.

An optical collimation plate 49 is disposed above the IC 1 with the light-emitting semiconductor chips 11, so that a collimator 51 is disposed above each group 13 of light-emitting semiconductor chips 11. The collimator 51 focuses the light and produces an approximately parallel beam path so that the light emitted from the light-emitting semiconductor chips 11 is emitted perpendicular to the top surface of the IC 1. In other words, the light from the μLEDs is collimated by means of the optical collimation plate 49. For this purpose, an injection molded part can be used as refractive optics for the optical collimation plate 49. Alternatively, micro-optical processes can be used, for example microlenses that are lithographically produced and remelted onto glass from lacquer, or hot micro-embossing or nanoimprint lithography.

Figure 14:
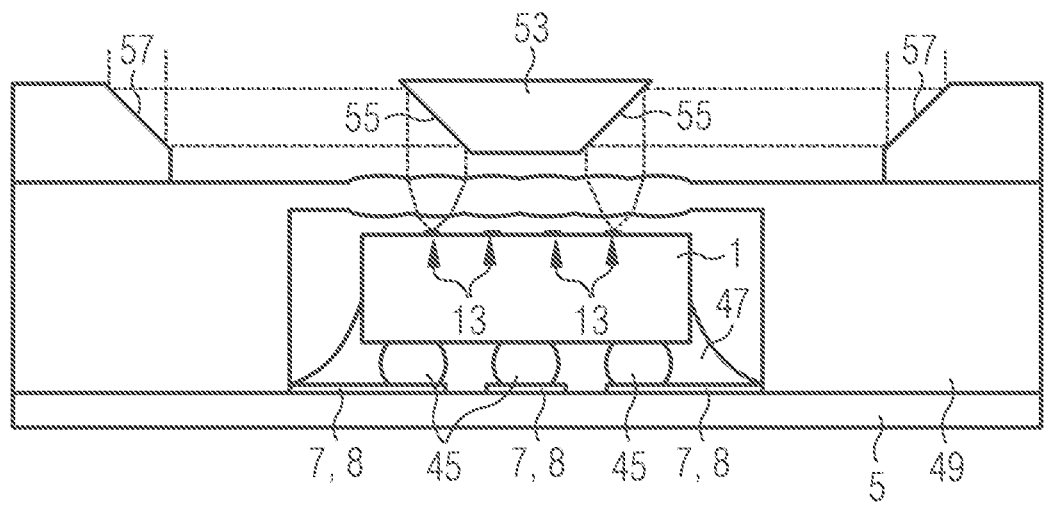
FIG. 14 shows a schematic representation of an exemplary embodiment of an intermediate product of the multi-pixel display device in a side section view.

FIG. 14 shows a schematic illustration of an exemplary embodiment of an intermediate product of the multi-pixel display device, based on the intermediate products previously shown in FIGS. 12 and 13, in the side section view.

An optical deflection plate 53 is arranged above the optical collimation plate 49, by means of which the deflection of the light beams from the light-emitting semiconductor chips 11 on the IC 1 to the pixels 40 takes place. The optical deflection plate 53 can be manufactured, for example, by a LIGA process (lithography, electroplating, molding). However, it can also be fabricated in lacquer by grayscale lithography. 3D printing is also feasible.

The optical deflection plate 53 has first reflectors 55 that direct the light emitted by the collimators 51 transversely away from the light-emitting semiconductor chips 11 and the IC 1 and direct it again perpendicularly to the pixels 40 of the display area via second reflectors 57. The reflectors 55, 57 can be mirrored. Suitable materials are Ni with Ag coating, glass or polymers (thermoplastics, thermosets) with metal coating (preferably Al or Ag).

Figure 15:
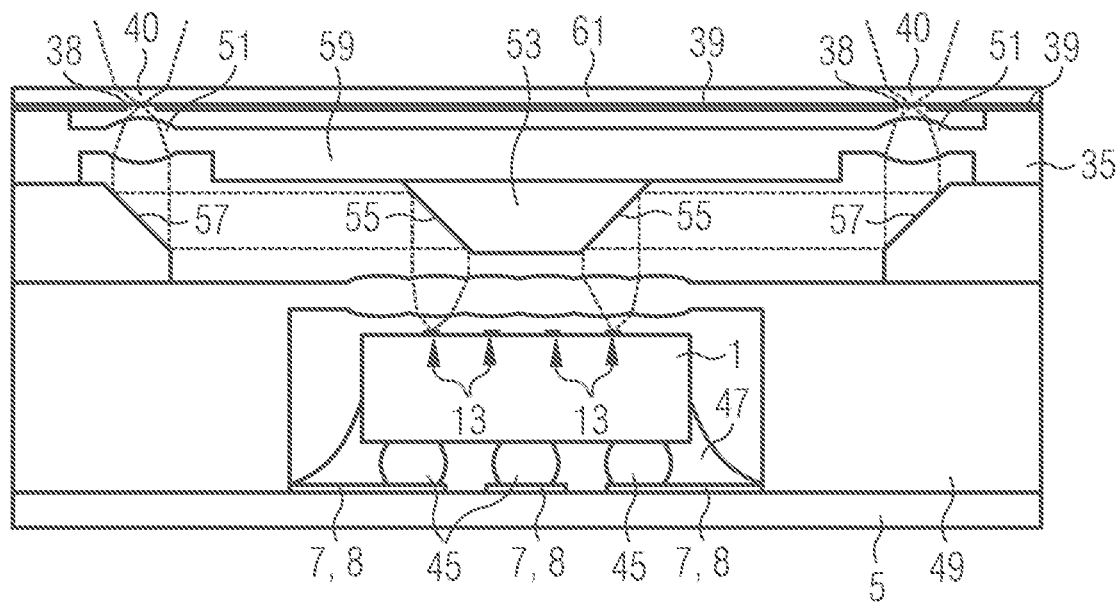
FIG. 15 shows a schematic representation of an exemplary embodiment of the multi-pixel display device in a side section view.

FIG. 15 shows a schematic diagram of an exemplary embodiment of a multi-pixel display device based on the intermediate product shown in FIG. 14, in the side section view.

An optional optical focusing plate 59 is provided above the optical deflection plate 53, by means of which the light for the pixels 40 is focused. In this embodiment, the light-directing element 35 with optical collimation plate 49, deflection plate 53 and focusing plate 59 is a free space optical system. A display area 37 arranged thereon has a black layer 39 with openings 38 for pixels 40. A scattering layer 61 is arranged above this.

The optical focusing plate 59 has collimators 51 and/or lenses by means of which much light is to be directed through the small apertures 38 in the black layer 39 for the pixels 40. The collimated light is directed in a focused manner through the apertures 38 in the black layer 39. Alternatively, it may fall on a diffusing plate and λ/4 plate with polarizer (not shown). In the previously described embodiments, the distance from the light source to the screen on which the pixels 40 are disposed is much less than 1 mm for a pixel pitch of 1 mm.

FIGS. 16 to 20 show various exemplary embodiments of arrangements of groups 13 of red, green, and blue light-emitting semiconductor chips 11 on the IC 1 in plan view.

Figure 16:
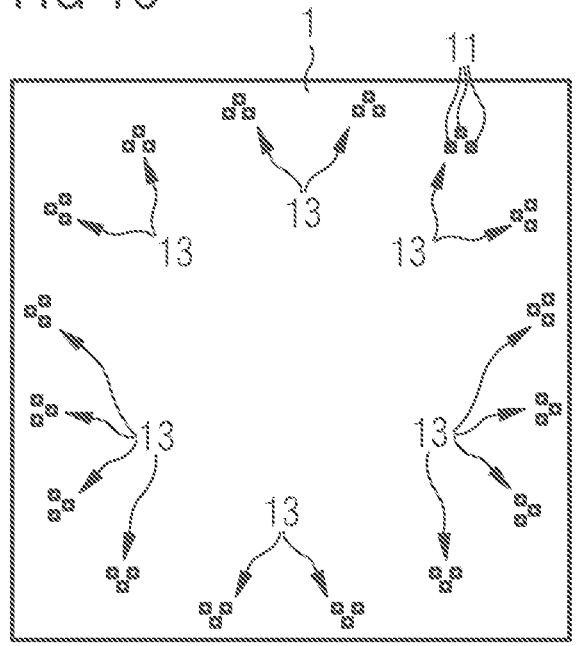
FIGS. 16 to 20 show exemplary embodiments of arrangements of light-emitting semiconductor chips on an integrated circuit.

FIG. 16 shows a circular arrangement of the groups 13 of light-emitting semiconductor chips 11 in order to make the area of the collimating lens as large as possible and also to have enough space for the deflection mirrors and the free space path or an alternative light deflection to the pixels 40.

Figure 17:
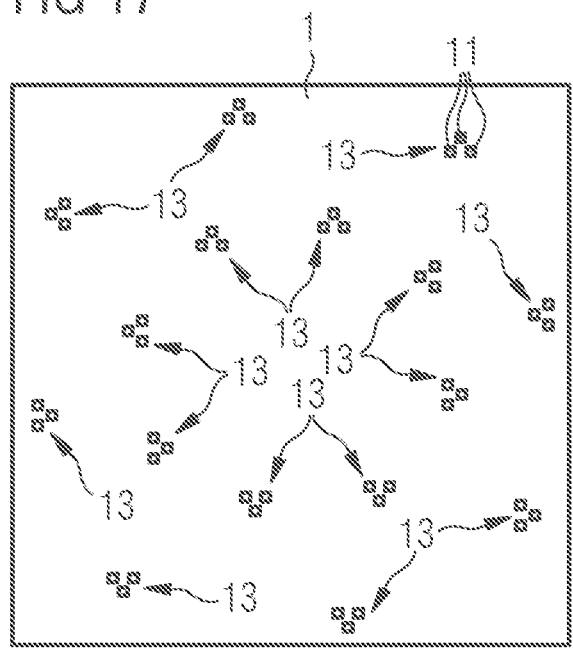

FIG. 17 shows an arrangement of the groups 13 of light-emitting semiconductor chips 11 along two concentric circles, again in order to make the area of the collimating lens as large as possible and also to have enough space for the deflection mirrors and the free space path or an alternative light deflection to the pixels 40.

Figure 18:
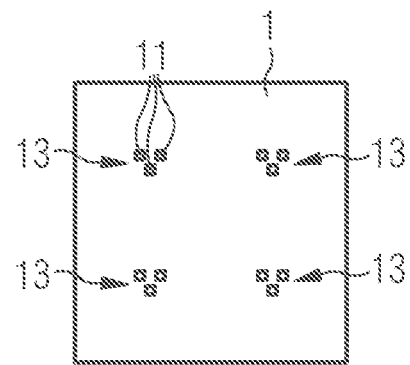

FIG. 18 shows the arrangement of light-emitting semiconductor chips in the corners of the IC 1 of square base area. This also exhibits the advantages described above.

Figure 19:
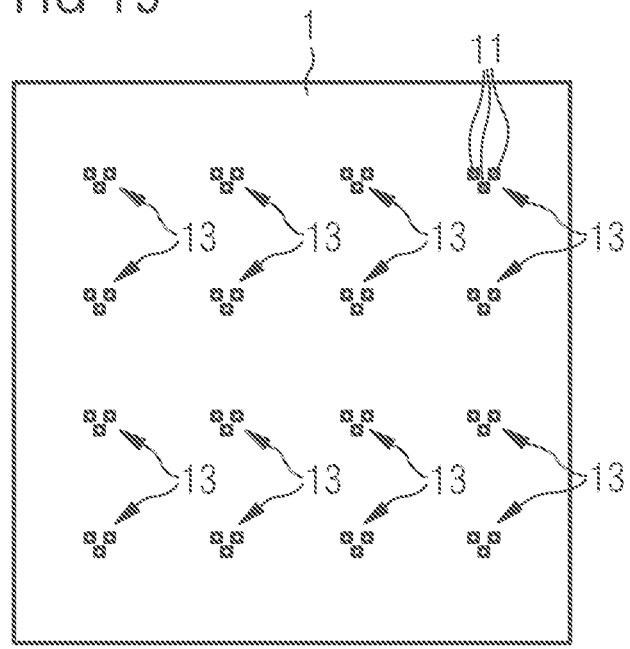

FIG. 19 shows the array-like arrangement of groups 13 of light-emitting semiconductor chips 11 in rows and columns for good light distribution to pixels 40.

Figure 20:
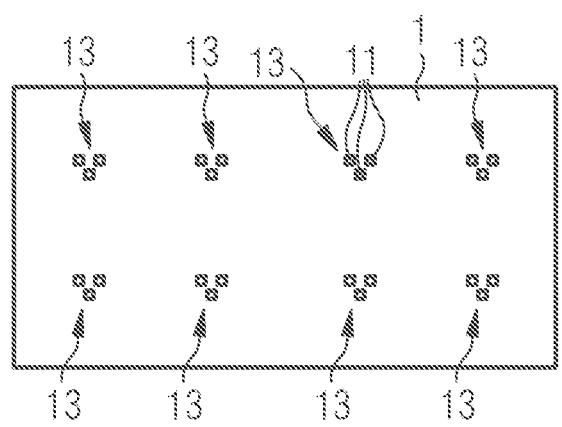

FIG. 20 shows the arrangement along two rows, which has the same advantages.

Figure 21:
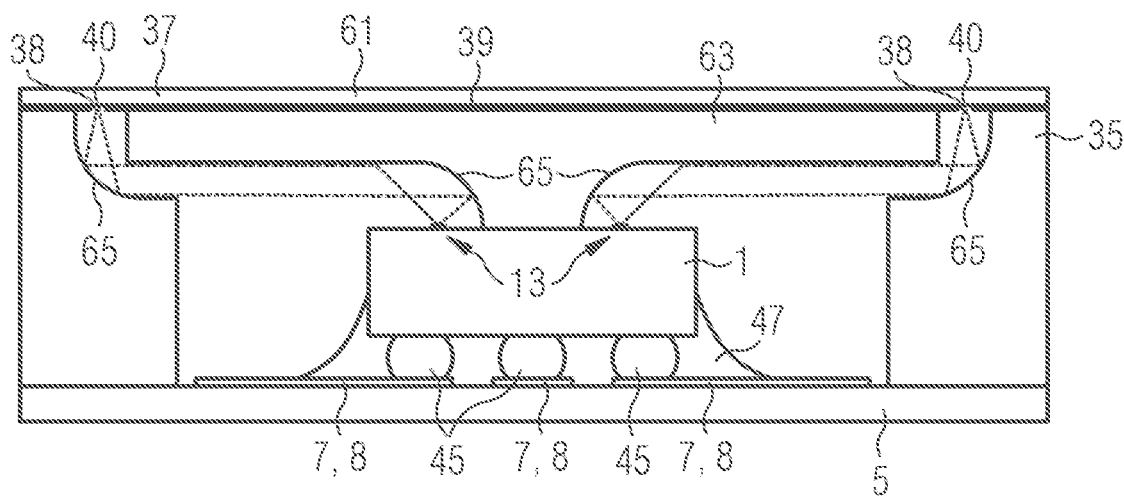
FIG. 21 shows a schematic representation of an exemplary embodiment of a multi-pixel display device in a side section view.

FIG. 21 shows a schematic diagram of an embodiment of a multi-pixel display device in the side sectional view.

The multi-pixel display device comprises an IC 1 mounted on a substrate 5 using flip-chip technology and having light-emitting semiconductor chips 11 on its upper surface, as has already been described in connection with the exemplary embodiment in FIGS. 10 to 15. It differs from the exemplary embodiment in FIG. 15 with respect to the light-guiding element 35, which is why the description concentrates on this aspect.

The light-directing element 35 on the IC 1 is also a free space optical element. It is an optical reflector body 63, also referred to as an optical circuit board, and has curved reflectors 65, formed as curved deflection mirrors, with which the light emitted from the light-emitting semiconductor chips 11 is directed to the pixels 40. The curved deflection mirrors 65 perform a lens function in addition to the deflection effect, so that fewer components are required. However, the manufacture of such curved deflection mirrors 65 is accompanied by an increased expenditure. On the light-directing element 35, there is a black layer 39 with apertures 38 as well as an optional scattering layer 61, which increases the beam angle of the pixels 40 and reduces glare due to its roughness. This is also known as the anti-glare effect.

In this exemplary embodiment, the lenses are replaced by curved deflection mirrors. These perform the same function as lenses. As a result, there are fewer components in the system. However, the manufacture of the mirrors is more complex.

Figure 22:
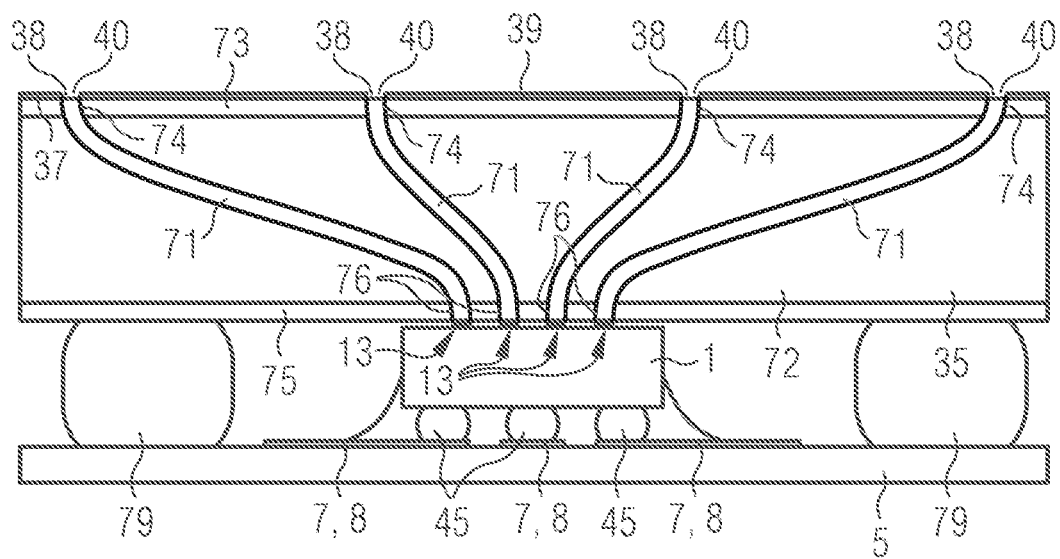
FIG. 22 shows a schematic representation of an exemplary embodiment of a multi-pixel display device in a side section view.

FIG. 22 shows a schematic diagram of an embodiment of a multi-pixel display device in a lateral sectional view.

The multi-pixel display device comprises an IC 1 mounted on a substrate 5 using flip-chip technology and having light-emitting semiconductor chips 11 on its upper surface, as already described in connection with the exemplary embodiment in FIGS. 10 to 15. The multi-pixel display device differs from embodiments in FIG. 15 with respect to the light-directing element 35, so the description will focus on this aspect.

The light-directing element 35 is positioned over the IC 1 by means of fastening elements 79, such as adhesives. It comprises a plurality of cable-shaped optical waveguides 71, also referred to as glass fibers, extending from the bottom side of the light-directing element 35 to its top side and enclosed by a filler material 72 which serves as mechanical protection and for fixing the optical waveguides 71. On the upper and lower sides, as mounting aids 73, 75, are plates with recesses 74, 76 in which the ends of the optical waveguides are positioned. The recesses 74, 76 are positioned above the groups 13 of light-emitting semiconductor chips 11 and at the location of the pixels 40. Light from the light-emitting semiconductor chips 11 is coupled directly into a glass fiber 71. This can be done with optics (not shown) or without optics in between, as shown here. The optical waveguides 71 are curved to guide the light to the respective pixel 40, where they again encounter either an aperture 38 in a black layer 39 or a scattering screen (not shown).

Micromechanically fabricated plate-shaped mounting aids 73, 75, into which the glass fibers 71 can be passively received in an adjusted manner, could be used to fabricate the light-guiding element 35. The space between the mounting aids 73, 75 may be filled with a rigid or flexible material 72. In the finished product, the mounting aids 73, 75 may or may not still be present.

To mount the entire screen, it would be conceivable to either first mount the ICs 1 on a substrate 5 and then mount the light distribution or, conversely, first mount the ICs on the light distribution and then mount them on the substrate 5. In the exemplary embodiment described above, the distance from the light source to the screen on which the pixels 40 are disposed is less than 2 mm with a pixel pitch of 1 mm.

Figure 23:
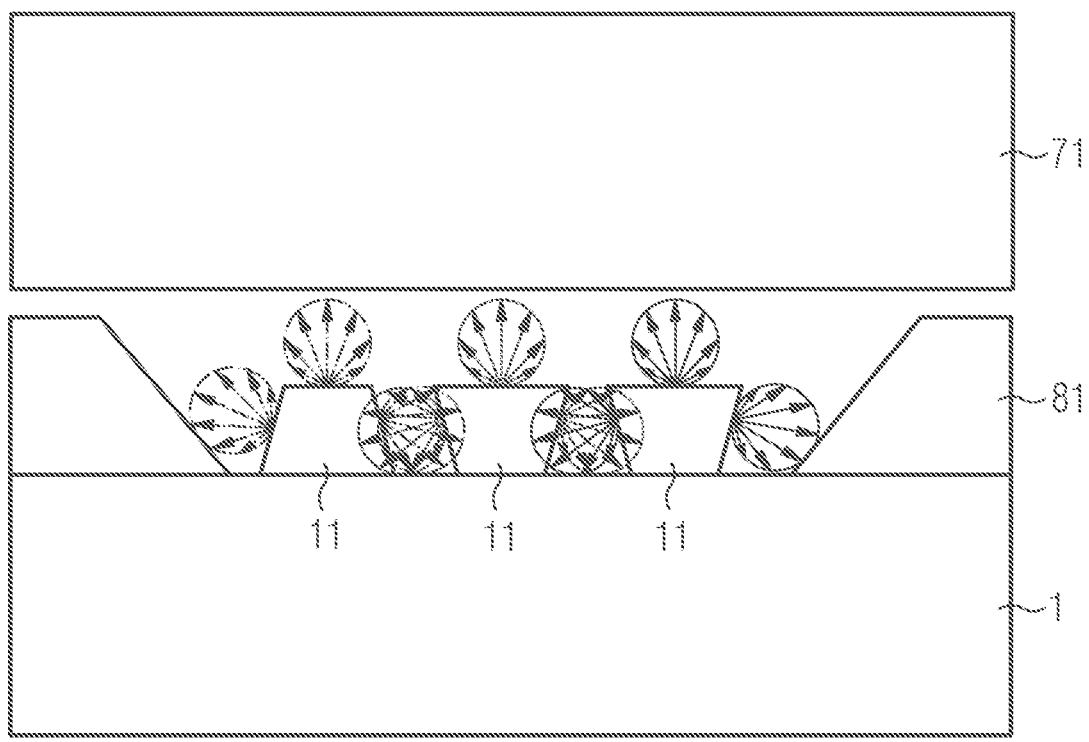
FIG. 23 shows an exemplary embodiment of an in-coupling area in a side section view.

FIG. 23 shows an embodiment of a in-coupling area, including a group 13 of light-emitting semiconductor chips 11 and the end region of optical fiber 71.

Exemplary embodiments of semiconductor chips 11 may be volume emitter shaped so that their light is emitted not only upwardly but also laterally. In order to also couple in these light components, reflectors 81 are provided at the sides of the light-emitting semiconductor chips 11 to direct the light to the end region of the optical fiber 71.

Especially for small µLEDs with 10 µm edge length and less, which also emit strongly to the side, it makes sense to provide a reflector on IC 1 for group 13, which is assigned to a pixel.

The embodiments described in FIGS. 22 and 23 can also be used for curved or flexible displays.

The features of the exemplary embodiments can be combined with each other. The invention is not limited by the description of the exemplary embodiments. Rather, the invention encompasses any new feature as well as any combination of features, which in particular includes any combination of features in the patent claims, even if this feature or combination itself is not explicitly stated in the patent claims or embodiments.

LIST OF REFERENCE SIGNS 1 integrated circuit, IC
3 arrow
5 substrate
7 conductive structure
8 contact area
9 contact
11 light-emitting semiconductor chip
13 group of light-emitting semiconductor chips
14 wire contact
17 casting
19 layer
21 opening
23 layer
25 layer
27 cover material
29 core material
31 light-guiding region
33 opening
35 light-directing element
37 display area
38 recess
39 black layer
40 pixel
41 planar connection
43 insulating layer
45 solder balls
47 underfill
49 collimation plate
51 collimator
53 deflection plate
55 reflector 57 reflector
59 focusing plate
61 scattering layer
63 reflector body
65 curved reflector
71 optical waveguide
72 filler material
73 mounting aid
74 opening
75 mounting aid
76 opening
79 fastening element
81 reflector

The invention claimed is:

1. A multi-pixel display device, comprising:
an integrated circuit,
a plurality of light-emitting semiconductor chips disposed on the integrated circuit,
a display area having a plurality of pixels, each of the light-emitting semiconductor chips being associated with one of the plurality of pixels,
a light-directing element disposed between the plurality of light-emitting semiconductor chips and the display area and adapted to direct light of each light-emitting semiconductor chip from the plurality of light-emitting semiconductor chips to its associated pixel,
wherein
the associated pixel to which the light is directed is arranged laterally offset above the light-emitting semiconductor chip associated therewith,
the light-directing element having a top side and a bottom side comprises a plurality of light-guiding structures each having an in-coupling area at the bottom side and an out-coupling area at the top side to the associated pixel, and
the light-emitting semiconductor chip is arranged overlapped to the in-coupling area of the light guiding structure comprising the out-coupling area to the associated pixel.

2. The multi-pixel display device according to claim 1, wherein more than one light-emitting semiconductor chip is associated with a pixel.

3. The multi-pixel display device according to claim 2, wherein the associated pixel to which the light is directed is arranged laterally offset above the light-emitting semiconductor chips associated therewith.

4. The multi-pixel display device according to claim 2, wherein the light-emitting semiconductor chips are arranged overlapped to the in-coupling area of the light guiding structure comprising the out-coupling area to the associated pixel.

5. The multi-pixel display device according to claim 1, wherein a reflector is disposed laterally of the light-emitting semiconductor chip or the plurality of light-emitting semiconductor chips to direct laterally emitted light to the in-coupling area.

6. The multi-pixel display device according to claim 1, wherein the light-directing element comprises a plurality of structured layers having light-guiding regions.

7. The multi-pixel display device according to claim 1, wherein the light-directing element comprises at least one collimator or lens.

8. The multi-pixel display device according to claim 1, wherein the light-directing element comprises at least one reflector for light deflection.

9. The multi-pixel display device according to claim 1, wherein the light-directing element comprises at least one focuser for bundling light.

10. The multi-pixel display device according to claim 1, wherein the light-directing element comprises at least one optical waveguide.

11. The multi-pixel display device according to claim 1, wherein the plurality of light-emitting semiconductor chips or groups of light-emitting semiconductor chips are arranged along one or more circles or along a line or in array on the integrated circuit.

12. The multi-pixel display device according to claim 1, wherein the display area comprises a dark layer with recesses.

13. The multi-pixel display device according to claim 1, wherein the display area comprises a scattering layer.

14. The multi-pixel display device according to claim 1, further comprising a substrate on which the integrated circuit is disposed and is electrically conductively connected to contact areas on the substrate.

* * * * *

UNITED STATES PATENT AND TRADEMARK OFFICE
CERTIFICATE OF CORRECTION

PATENT NO. : 11,984,435 B2
APPLICATION NO. : 17/289114
DATED : May 14, 2024
INVENTOR(S) : Thomas Schwarz et al.

Page 1 of 1

It is certified that error appears in the above-identified patent and that said Letters Patent is hereby corrected as shown below:

On the Title Page

In Item (54) Title of the Invention:
"MULTI-PIXEL DISPLAY DEVICE WITH LIGHT-GUIDING STRUCTURES AND LIGHT-EMITTING SEMICONDUCTOR CHIPS DISPOSED ON INTERATED CIRCUIT"
Should be corrected to read:
-- MULTI-PIXEL DISPLAY DEVICE WITH LIGHT-GUIDING STRUCTURES AND LIGHT-EMITTING SEMICONDUCTOR CHIPS DISPOSED ON INTEGRATED CIRCUIT --

In the Specification

In Column 1, Line 4:
"INTERATED CIRCUIT"
Should be corrected to read:
-- INTEGRATED CIRCUIT --

Signed and Sealed this
Twenty-fifth Day of February, 2025

Coke Morgan Stewart
*Acting Director of the United States Patent and Trademark Office*